United States Patent
Prokopp

(10) Patent No.: US 6,441,636 B1
(45) Date of Patent: Aug. 27, 2002

(54) DEVICE FOR TESTING PRINTED BOARDS

(75) Inventor: Manfred Prokopp, Wertheim-Reicholzheim (DE)

(73) Assignee: ATG Test Systems GmbH & Co. KG, Wertheim (DE)

( * ) Notice: Subject to any disclaimer, the term of this patent is extended or adjusted under 35 U.S.C. 154(b) by 0 days.

(21) Appl. No.: 09/622,391

(22) PCT Filed: Apr. 16, 1999

(86) PCT No.: PCT/EP99/02753

§ 371 (c)(1),
(2), (4) Date: Aug. 14, 2000

(87) PCT Pub. No.: WO00/26681

PCT Pub. Date: May 11, 2000

(30) Foreign Application Priority Data

Nov. 2, 1998 (DE) .......................... 198 50 367

(51) Int. Cl.$^7$ .......................... G01R 31/28; G01R 31/02
(52) U.S. Cl. ..................................... 324/765; 324/158.1
(58) Field of Search .............................. 324/158.1, 537, 324/538, 512, 522, 523; 714/724, 733, 734

(56) References Cited

U.S. PATENT DOCUMENTS

| | | | | |
|---|---|---|---|---|
| 3,849,872 A | * | 11/1974 | Hubacher ................. | 324/158.1 |
| 5,241,266 A | * | 8/1993 | Ahmad et al. ............... | 714/733 |
| 5,294,776 A | * | 3/1994 | Furuyama ................ | 324/158.1 |
| 5,444,366 A | * | 8/1995 | Chiu ........................ | 324/158.1 |
| 6,154,863 A | | 11/2000 | Prokopp ..................... | 714/724 |

OTHER PUBLICATIONS

Search Report for EP 0838688, May 4, 1999.
Vanderhelm, "Smart Tester For Flex Interface" Motorola Inc., Technical Developments, vol. 19, Jun. 1993, pp. 88–90.
Newsom et al., "Card Test Flexibility With Reduced Lead Length" IBM Technical Disclosure Bulletin, vol. 23, No. 7B, Dec. 1980, pp. 3096–3097.

* cited by examiner

Primary Examiner—Ernest Karlsen
(74) Attorney, Agent, or Firm—Rankin, Hill, Porter & Clark LLP

(57) ABSTRACT

The invention relates to a printed circuit board tester, more particularly for testing large-area non-componented circuit boards, comprising a grid pattern provided with contact points arranged in a predetermined pattern, several contact points in each case being electrically connected to a straight-line scanning channel and an adapter and/or a translator being mounted of said grid pattern, an electronic analyzer electrically connected to said contact points via said scanning channels, a circuit board to be tested to which said adapter and/or said translator may be applied such that said adapter and/or translator produces an electrical contact of said circuit board test points on said circuit board to said contact points of said grid pattern, and a means for electrically connecting at least two scanning channels.

13 Claims, 3 Drawing Sheets

DEVICE FOR TESTING PRINTED BOARDS

The invention relates to a printed circuit board tester.

The invention is based on prior art according to EP 875 767 A2 which was published by the applicant of the present patent application, disclosing a test fixture comprising a plurality of test connections, in which circuit board test points of the board under test are in contact with a test connection via an electrical connection.

The electronic analyzer is electrically connected to a grid pattern on which an adapter and/or a translator is mounted on which a circuit board to be tested may be placed. The adapter and/or translator produces an electrical contact from the circuit board test points of the board under test to contact points of the grid pattern.

This test fixture is characterized by at least two contact points being electrically connected to each other. More particularly, in this tester several contact points in each case are electrically connected to each other along a straight-line scanning channel in each case. The individual scanning channels are electrically connected to an electronic analyzer. Since each scanning channel is connected to several contact points the number of units of the electronic analyzer as compared to an electronic analyzer of a comparable tester is considerably reduced and the overall configuration of the test fixture becomes very simple.

Although in this test fixture several test points are electrically connected to a single scanning channel, it has been found out surprisingly that in by far the majority of applications no double assignments of the scanning channels occur or that any such double assignments may be reliably obviated by dictating the assignment of the circuit board test points to the contact points of the test fixture. This is achieved by the known tester creating a high contact point density by relatively uncomplicated means, requiring for instance an average spacing of 800 $\mu$m or less between adjacent contact points. This high circuit board test point density is of advantage since it permits contacting a correspondingly high local circuit board test point density whilst, at the same time, making a sufficient redundancy available due to the contact point density thus enabling a double assignment of a scapning channel to be reliably avoided.

The object of the present invention is to provide a simple and low-cost tester for testing large-area circuit boards such as, for instance, backplanes sized e.g. 1000 mm×750 mm. Large-area circuit boards in the sense of the invention are circuit boards sized at least 500 mm×500 mm, i.e. having a surface area of at least 250,000 mm$^2$.

This object is achieved by a printed circuit board tester having the features as they read from claim 1. Advantageous aspects read from the sub-claims.

Figure 1:
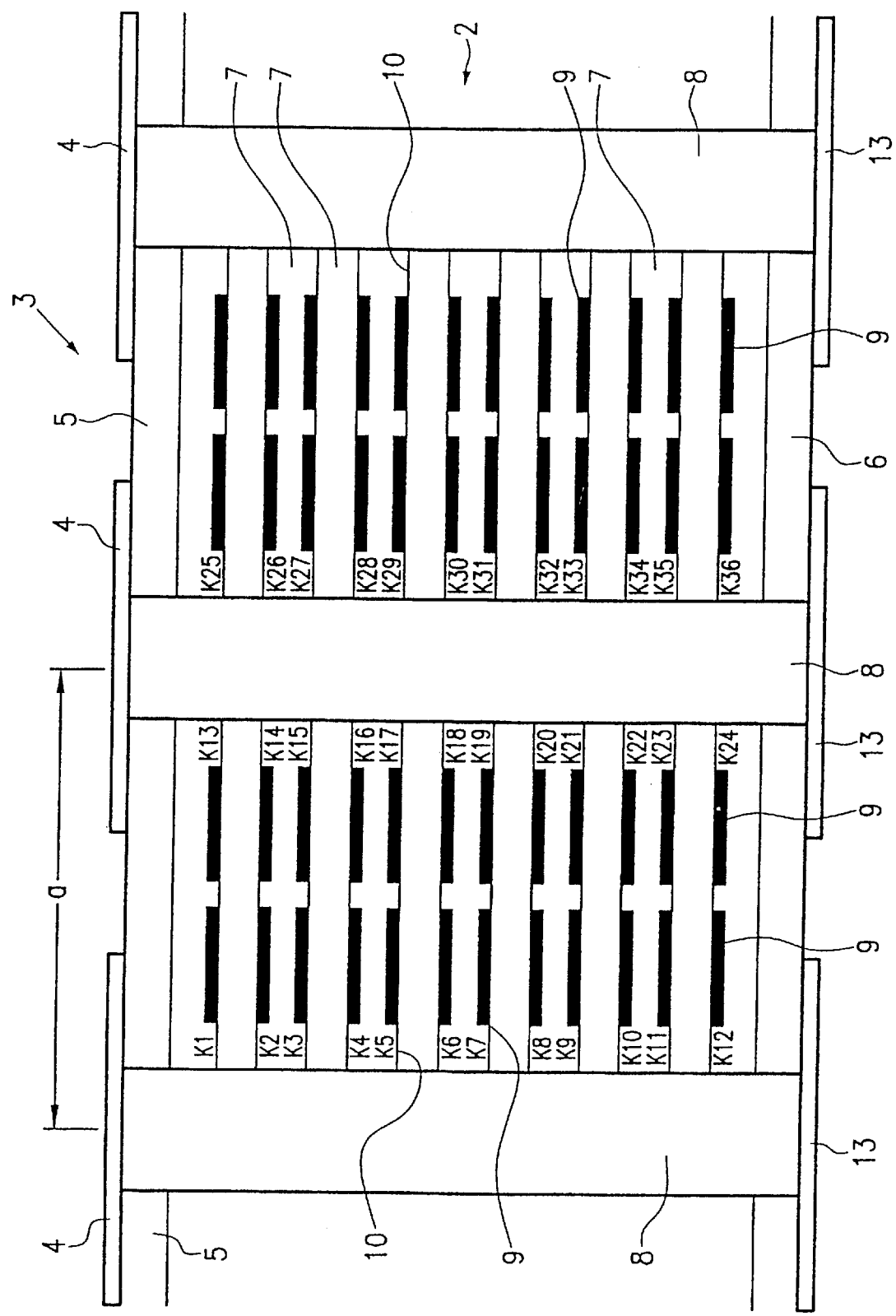
Figure 2:
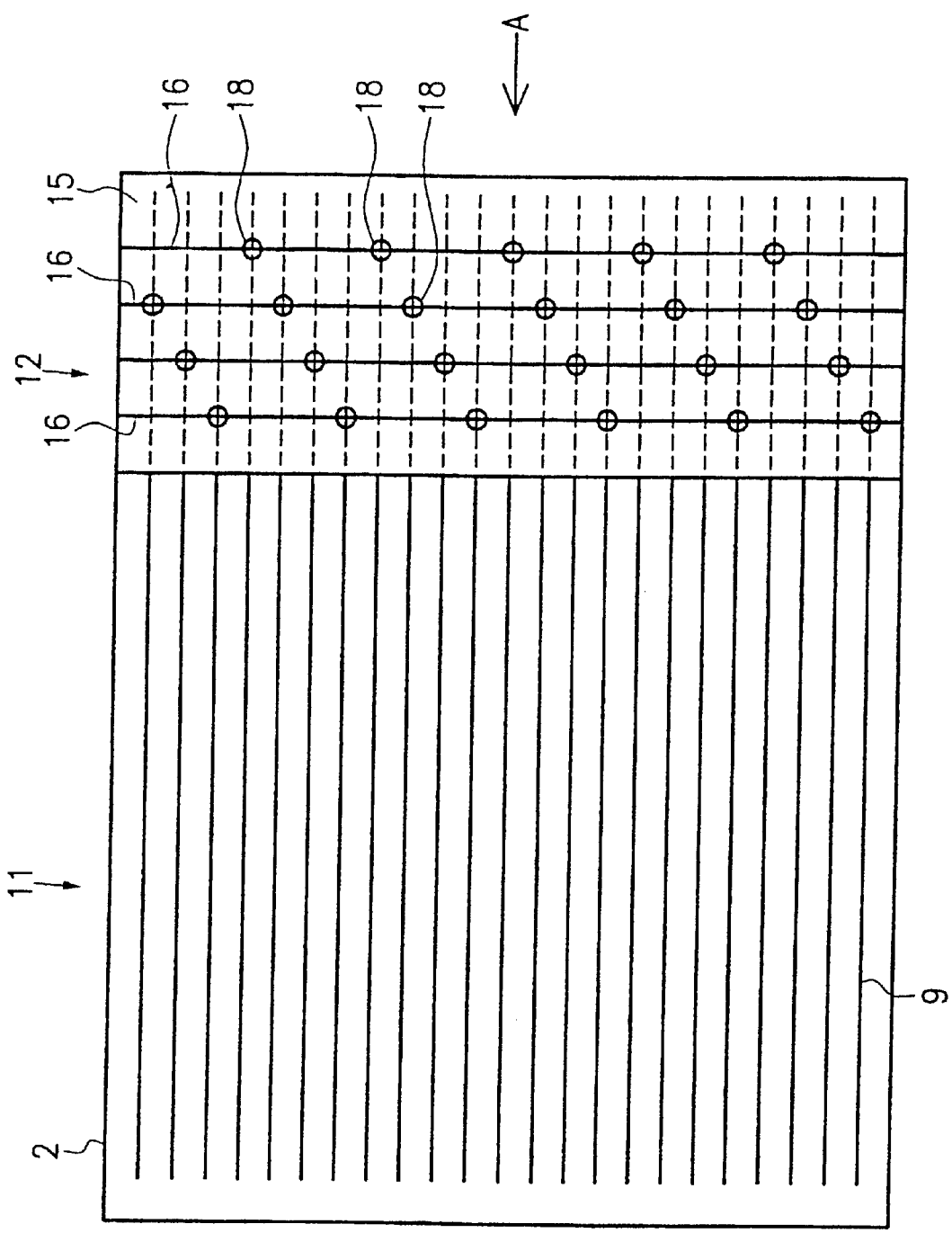
Figure 3:
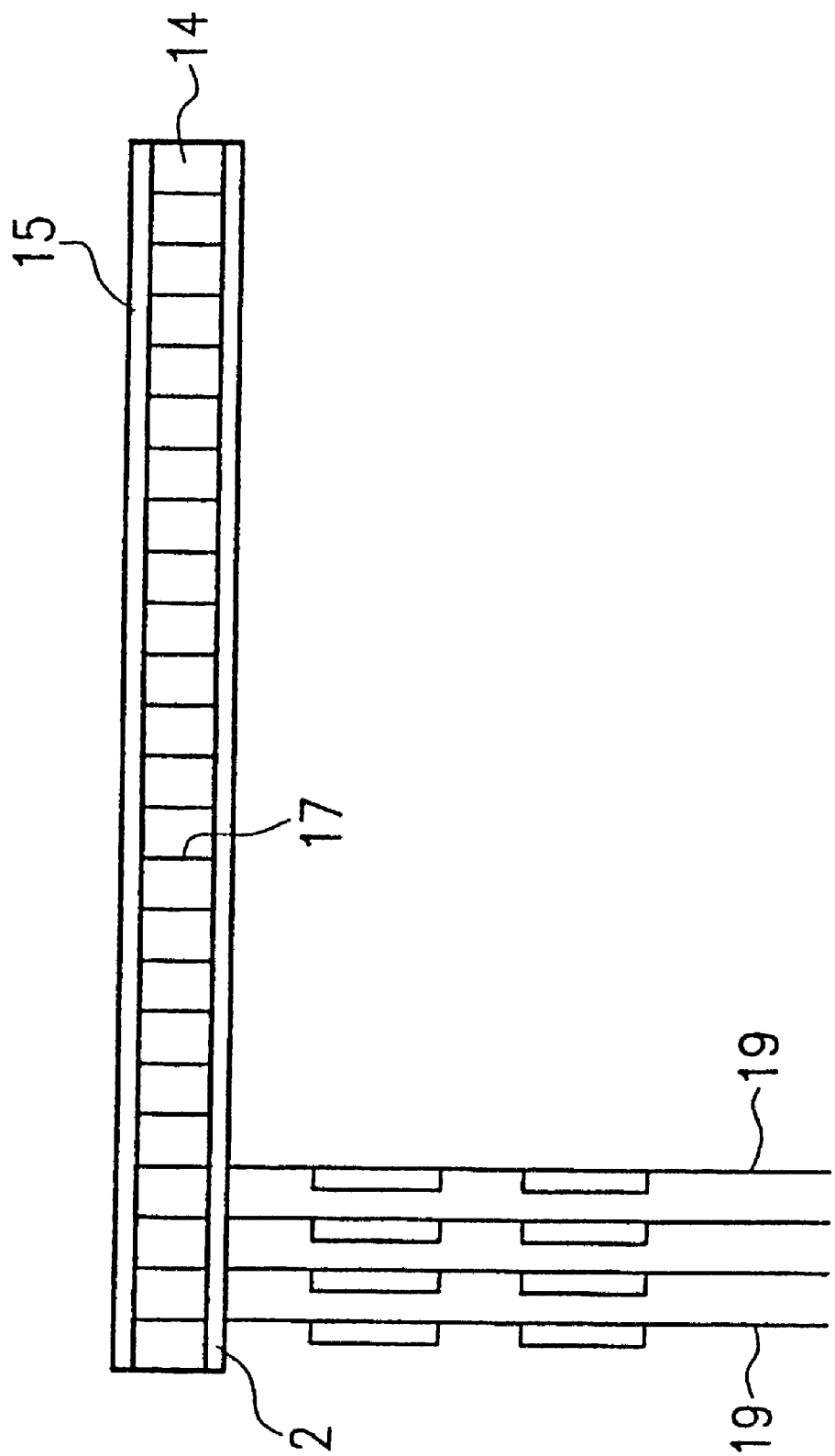

The invention will now be detained by way of example embodiments with reference to the schematic drawings in which FIG. 1 is a section through a portion or a grid base taken transversely to the scanning channels, FIG. 2 is a schematic illustration, greatly simplified, of the an array of scanning channels and of a bus board connecting several scanning channels to each other, and FIG. 3 is a front view of the arrangement as shown in FIG. 2 (i.e. as viewed in the direction of the arrow A therein).

The tester 1 in accordance with the invention comprises a grid base 2 including a grid pattern 3 arranged on its upper side made up of a plurality of electrically conducting contact points 4 arranged in a regular pattern.

The grid base 2 is configured preferably as a laminated circuit board. The example embodiment as shown in FIG. 1 comprises a top and bottom defining layer 5, 6 with thirteen intermediate layers 7 inbetween.

Extending from the contact points 4 vertically through the topmost layer 5 and all intermediate layers 7 in each case is a vertical through-connection 8. The through-connections 8 are configured as a rule as through-holes with a conductive metallized plating. The through-connections 8 and thus the contact points 4 are arranged, for example, in a regular square pattern, the grid pattern, having a center-spacing of e.g. 1.27 mm, although, of course, other types of a regular pattern are possible.

The through-connections 8 and this the contact points 4 are accordingly arranged in rows. Embedded in the grid base 2 between two rows of throughconnections connection 8 in each case are conductor paths 9, termed scanning channels in the following.

In the example embodiment as shown in FIG. 1 twelve such scanning channels are provided in each case between two rows of through-connections 8, each of the scanning channels 9 being arranged in pairs sandwiched between two intermediate layers 7. The scanning channels 9 arranged in each case as twelve pairs adjacent to a row of through-connections 8 are assigned to this row, i.e. each through-connection 8 and thus each contact point 4 of any one row is electrically connected to one of the scanning channels 9 assigned to this row via a branch conductor 10. In the present example embodiment each 24th contact point 4 in any one row is electrically connected in each case to the same scanning channel 9.

FIG. 2 illustrates in a plan view the grid base 2 in accordance with the invention, the grid pattern being illustrated greatly simplified by the run of the scanning channels 9 and without the contact points 4. To make for an uncluttered illustration only a few of the scanning channels 9 located parallel in a plane are shown.

The grid base 2 comprises a test zone 11 which is roughly square in the example embodiment shown and a connection zone 12 extending beyond the test zone 11. On the connection zone 12, the same as on the test zone 11. contact points 4 as shown in FIG. 1 are provided on the top side as well as contact points 13 on the bottom side, each of which is electrically connected to the scanning channels 9 by means of the through-connections 8 and the branch conductors 10. Directly located on the top side is a bus adapter 14 mounting in turn a bus board 15. The bus board 15 comprises parallel bus conductors 16 oriented transversely to the scanning channels 9. The bus conductors 16 are arranged either located open on the surface of the bus board 15 facing the bus adapter 14 or electrically connected to the contact points arranged on the surface of the bus board 15 on the center-spacing of the rows of through-connections 8.

The bus adapter 14 comprises a plurality of contact pins 17, each of which electrical connects a scanning channel 9 to a bus conductor 16. The intersection points of the scanning channels 9 electrically connected by a contact point 17 with the bus conductors 16 are identified in each case in FIG. 2 by a circle 18. The contact pins 17 are preferably configured as spring contact pins.

Providing the bus adapter 14 and the bus board 15 results in several scanning channels 9 being electrically interconnected in each case via the bus conductors 16.

Each array of electrically interconnected scanning channels 9 is electrically connected to an electronics card 19 of the electronic analyzer, i.e. only a single connection to the electronic analyzer is needed for a plurality of scanning channels thus achieving a drastic reduction in the number of units of the electronic analyzer as compared to conventional testers for the same number of contact points, since conventional testers require a separate connection for each contact point and thus a corresponding electronic analyzer processing capacity assigned to the connection.

The electronics cards are connected to the grid base electrically and mechanically e.g. by means of a flex conductor and spring pins as known from DE 196 27 801 C1.

Now, by means of the invention not only the contact points arranged along a straight-line scanning channel but also the contact points distributed over the surface area of the grid base are electrically connected.

Simulations have shown that in the case of large-area circuit boards, such as e.g. backplanes, the majority of the contact points 4 provided on the grid base are not electrical contacted, so that that any multiple assignment of the scanning channels 9 interconnected electrically may be simply avoided whilst at the same time making a high density of contact points 4 available which is of advantage in crowded locations of circuit board test points on the board under test.

The tester in accordance with the invention may be configured e.g. for testing backplanes sized 1000 mm×600 mm. Such backplanes have e.g. roughly 20,000 circuit board test points needing to be contacted by the tester. Usual testers comprise a grid spacing of one-tenth of an inch so that conventional testers comprise a grid pattern involving 160,000 contact points, each of which needs to be connected to the electronics of the tester. This is why these testers comprise electronics for testing 160,000 contact points requiring a correspondingly high number of electronics cards. Now, due to linking the contact points 4 in the test zone in accordance with the invention a plurality of contact points are connected jointly to but a sole input of tester electronics in each case, thus permitting a drastic reduction in the number of electronics cards required whilst still enabling all contact points 4 of the tester in contact with the circuit board being tested to be properly signalled.

With the configuration of a tester in accordance with the invention it is now o also possible to provide such large test zones with an increased contact point density, e.g. double contact point density, without needing to increase the electronics accordingly. Such an increase in contact density is expedient when contact point zones having crowded locations are provided on the circuit board, as is necessary, e.g. in the case of advanced highly integrated ICs.

Yet another advantage afforded by the invention is that the electrical connections between the scanning channels 9 may now be varied by varying the arrangement of the contact pins 17 in the bus adapter 14 to thus permit generating on a single grid base 2 differing linkages of the contact points 4 in the test zone 11 tailored to the circuit board being tested.

It will be appreciated that the invention is not restricted to the example embodiment as detained above, instead also an embodiment in which the electronics cards are connected to the bus board is likewise within the scope of the present invention, for example, whereby bus adapter and bus board are arranged below the grid base, for instance. It is also possible that the bus board is provided with insertion pins for direct insertion into the hollow test connections configured uncovered in the connection zone 12. In such an embodiment no adapter is needed since the bus board is directly connected to the grid base. However, any other connecting technique is possible with the invention for selectively electrically connecting the scanning channels. For instance, the bus adapter may be configured as a rubber adapter, one such rubber adapter being a elastic rubber board having electrically conducting sections electrically connecting the scanning channels to the bus conductors.

What is claimed is:

1. A tester for testing a large-area, non-componented printed circuit board having a plurality of test points, comprising:

an electronic analyzer comprising a plurality of test connections;

a grid base having a side provided with a grid pattern comprising a plurality of contact points arranged in a predetermined pattern, each of said contact points being electrically connected to at least one of a plurality of straight-line scanning channels, wherein several of said contact points are electrically connected to each straight-line scanning channel and wherein an electrical connection can be made between said test points and at least some of said contact points when an adapter and/or a translator is mounted between said grid pattern and said printed circuit board being tested; and a means for electrically connecting a plurality of scanning channels together to form groups of electrically connected scanning channels, wherein each group of electrically connected scanning channels is connected to one of said test connections of said electronic nalyzer.

2. The tester as set forth in claim 1, wherein said means for electrically connecting a plurality of scanning channels together comprises a bus board comprising several bus conductors running preferably in parallel to said scanning channels which may be selectively brought into contact with said scanning channels.

3. The tester as set forth in claim 2, wherein a bus adapter is arranged between said bus board and said grid pattern.

4. The tester as set forth in claim 2, wherein said bus board is provided with contact elements for directly contacting said scanning channels.

5. The tester as set forth in claim 2, wherein said grid base comprises a test zone in which said contact points connected to said scanning channels are arranged for electrically contacting the test points of a circuit board to be tested and a connection zone in which further contact points connected to said scanning channels are provided for contacting said bus conductors.

6. The tester as set forth in claim 4, wherein said grid base comprises a test zone in which said contact points connected to said scanning channels are arranged for electrically contacting said test points of a circuit board to be tested and a connection zone in which further contact points connected to said scanning channels are provided for contacting said bus conductors.

7. The tester as set forth in claim 5, wherein contact points for contacting said electronic analyzer are provided in said connection zone on a side of said grid base opposite to said side of said grid base provided with contact points for contacting said bus conductors.

8. The tester as set forth in claim 6, wherein contact points for contacting said electronic analyzer are provided in said connection zone on a side of said grid base opposite to said side of said grid base provided with contact points for contacting said bus conductors.

9. The tester as set forth in claim 7, wherein said contact points are arranged in opposing pairs on said grid base and each contact point in an opposing pair is connected to a scanning channel separate from the other.

10. The tester as set forth in claim 8, wherein said contact points are arranged in opposing pairs on said grid base and each contact point in an opposing pair is connected to a scanning channel separate from the other.

11. The tester as set forth in claim 5, wherein said test zone has a surface area of at least 250,000 mm$^2$.

12. The tester as set forth in claim 10, wherein said test zone has a surface area of at least 250,000 mm$^2$.

13. A printed circuit board tester comprising:

a grid base having a grid pattern provided thereon, said grid pattern comprising contact points arranged in a predetermined pattern, several of said contact points being electrically connected to each of a plurality of straight-line scanning channels;

an electronic analyzer having a plurality of test connections; and a means for electrically connecting a plurality of said scanning channels together to form groups of electrically connected scanning channels, each group of electrically connected scanning channels being connected to only one of said test connections of said electronic analyzer.

* * * * *